United States Patent [19]
Crowley et al.

[11] Patent Number: 5,517,118
[45] Date of Patent: May 14, 1996

[54] SUBSLICING FOR REMOTELY POSITIONED MRI

[75] Inventors: Christopher W. Crowley, San Diego; Freeman H. Rose, Jr., Del Mar, both of Calif.

[73] Assignee: Panacea Medical Laboratories, Carlsbad, Calif.

[21] Appl. No.: 232,622

[22] Filed: Apr. 25, 1994

[51] Int. Cl.$^6$ ............................................... G01R 33/48
[52] U.S. Cl. ............................................... 324/309
[58] Field of Search ........................... 324/307, 309, 324/306, 304, 314, 312; 128/153.2

[56] References Cited

U.S. PATENT DOCUMENTS

| | | | |
|---|---|---|---|
| 4,296,378 | 10/1981 | King | 324/316 |
| 4,379,262 | 4/1983 | Young | 324/309 |
| 4,471,306 | 9/1984 | Edelstein | 324/309 |
| 4,521,733 | 6/1985 | Bottomley | 324/309 |
| 4,542,343 | 9/1985 | Brown | 324/307 |
| 4,656,425 | 4/1987 | Bendel | 324/309 |
| 4,684,891 | 8/1987 | Feinberg | 324/309 |
| 4,721,914 | 1/1988 | Fukushima | 324/320 |
| 4,972,148 | 11/1990 | Jensen | 324/309 |
| 5,023,554 | 6/1991 | Cho | 324/309 |
| 5,045,794 | 9/1991 | Dorri | 324/320 |
| 5,144,241 | 9/1992 | Oppelt | 324/318 |
| 5,164,696 | 11/1992 | Kotani | 335/216 |
| 5,166,619 | 11/1992 | Ries | 324/318 |
| 5,167,232 | 12/1992 | Parker et al. | 324/306 |
| 5,241,271 | 8/1993 | Taguchi et al. | 324/309 |
| 5,304,930 | 4/1994 | Crowley | 324/309 |
| 5,315,249 | 5/1994 | Le Roux et al. | 324/309 |

OTHER PUBLICATIONS

*Ultra–Fast Imaging*, Mark S. Cohen and Robert M. Weisskoff, Magnetic Resonance Imaging, vol. 9, pp. 1–37, 1991.

*Nuclear Magnetic Resonance Microscopy with 4–um Resolution: Theoretical Study and Esperimental Results*, Z. H. Cho, C. B. Ahn, S. C. Juh, H. K. Lee, R. E. Jacobs, S. Lee, J. H. Yi, J. M. Jo, Medical Physics, vol. 15, No. 6, Nov./Dec. 1988.

*Removal of Static Field Inhomogeneity and Chemical–Shift Effects in NMR Imaging*, J. B. Miller and A. N. Garroway, Journal of Magnetic Resonance 67, 575–579, 1986.

*Spin–Inversion Imaging: A Technique for NMR Imaging Under Magnetic Fields with High Field Nonuniformities*, Tak Sum Wong and Dov Rosenfeld, IEEE Transactions on Medical Imaging, vol. MI–6, No. 2, Jun. 1987.

*Echo Projection Imaging—A Method to Obtain NMR Images Undistorted by Magnet Field Inhomogeneities*, Peter Bendel, IEEE Transactions on Medical Imaging, vol. MI–4, No. 2, Jun. 1985.

*New, Compensated Carr–Purcell Sequences*, Terry Gullion, Journal of Magnetic Resonance 89, 479–484, 1990.

*Fast–Scan Magnetic Resonance: Principles and Applications*, Felix W. Wehrli, Magnetic Resonance Quarterly, vol. 6, No. 3, pp. 165–236, 1990.

*Primary Examiner*—Sandra L. O'Shea
*Assistant Examiner*—Raymond Y. Mah
*Attorney, Agent, or Firm*—Nydegger & Associates

[57] ABSTRACT

A method for using a remotely positionable MRI device to construct an image of a slice of in situ biological tissue includes creating and combining NMR images of subslices of the total slice of tissue to be imaged. More specifically, with the device positioned to record nuclei spin echoes from the slice of tissue to be imaged, the slice is divided into n different subslices and these subslices are imaged using a particular Larmor frequency for each subslice. In accordance with the present invention, n is an integer having a value less than $T_1/T_2$, where $T_1$ is the spin lattice relaxation time of the nuclei being imaged and $T_2$ is the spin-spin relaxation time of the nuclei being imaged (n is approximately equal to 10). All n subslice images are then combined to create the image for the slice.

28 Claims, 2 Drawing Sheets

SUBSLICING FOR REMOTELY POSITIONED MRI

FIELD OF THE INVENTION

The present invention pertains generally to MRI devices and methods for imaging in situ biological tissue. More particularly, the present invention pertains to a method for selectively imaging subslices of a slice of in situ tissue, and then separately displaying images of the subslices or combining the subslice images to create a useable NMR image of the total slice. The present invention is particularly, but not exclusively, useful for creating NMR images using a remotely positionable MRI device which generates a non-homogeneous magnetic field.

BACKGROUND OF THE INVENTION

Remotely positionable Magnetic Resonance Imaging (MRI) devices have many advantages which stem primarily from the fact they can produce images of in situ biological tissue without requiring that the device surround and confine the tissue being imaged. By virtue of being remotely positionable, however, they also have unique characteristics which must be taken into consideration. For instance, a remotely positionable MRI device generates an inhomogeneous magnetic field. This fact, alone, has a very significant effect on how the device is designed and how it operates.

In order to obtain useable images of in situ tissue with a remotely positioned MRI device, there needs to be a defined measurement region within the inhomogeneous magnetic field which is specifically configured for NMR imaging. More specifically, it is the measurement region which coincidently covers the tissue that is to be imaged during the operation of the MRI device. Although the specific configuration for the measurement region can be varied somewhat according to the desires of the operator, for medical applications the measurement region will typically have a nearly flat planar configuration. Further, the measurement region will typically be relatively thin, with an overall thickness that is about half a centimeter (0.5 cm). This particular configuration is preferred so that a realistic two dimensional picture of in situ tissue in the plane of the measurement region can be created.

As is well known to skilled artisans, Magnetic Resonance Imaging (MRI) is a diagnostic procedure that is extensively used in the medical field to noninvasively image internal biological tissue. As is also well known, MRI relies on the nuclear magnetic resonance (NMR) of nuclei, and the fact that when tissue nuclei are placed in the environment of a strong external magnetic field they will each assume a discrete energy state. Further, NMR takes advantage of the fact that while tissue nuclei are influenced by an external magnetic field, radio frequency (RF) energy will induce changes in their energy states to generate spin echo signals which are characteristic of the tissue. The RF radiation which is most effective for inducing such changes has a particular frequency (known as the Larmor frequency) which depends on the magnitude of the magnetic field at the location of the nucleus.

In one important respect, the present invention is quite different from conventional MRI systems. As implied above, this difference arises from the fact that NMR is normally performed in nearly homogeneous magnetic fields where there is a nearly constant field strength. Thus, with essentially no field strength gradient the range or bandwidth of Larmor frequencies necessary for NMR is very small. The system and method of the present invention, however, uses an inhomogeneous magnetic field. Inhomogeneous magnetic fields, unlike homogeneous magnetic fields, have a field strength gradient ($G_z$) that dominates the behavior of nuclei in the magnetic field. Consequently, because there is a continual change in the field strength, due to $G_z$, inhomogeneous magnetic fields require a much greater bandwidth of Larmor frequencies to tilt and refocus nuclei in a slice of in situ biological tissue during MRI. For an effective MRI procedure using an inhomogeneous magnetic field, this is a factor which must be dealt with.

The requirement for an increased bandwidth of RF radiation arises because, in the presence of a field strength gradient each nucleus along the direction of the gradient will be influenced by a slightly different field strength. Thus, each nucleus will have a slightly different Larmor frequency. The consequence of this is that, as more nuclei are to be influenced by different field strengths during an MRI procedure, the bandwidth of the RF radiation must necessarily be broadened to include all of the required Larmor frequencies. For a measurement region having a thickness of approximately 0.5 cm, and a field strength gradient of approximately two hundred Gauss per centimeter (200 Gauss/cm), the bandwidth will be about four hundred and twenty KiloHertz (420 KHz). A broadened bandwidth introduces additional noise which lowers the signal-to-noise ratio (SNR) and makes detection of the spin echoes more difficult. Also, large bulky equipment is needed to generate high bandwidth pulses of RF energy. Thus narrower bandwidths are preferable. For a complete disclosure and discussion of the phenomenon which impact NMR using inhomogeneous magnetic fields, refer to U.S. Pat. No. 5,304,930 to issue on Apr. 19, 1994, for an invention entitled "Remotely Positioned MRI System" which is assigned to the same assignee as the present invention, and which is incorporated herein by reference.

An additional consideration which is pertinent to MRI procedures wherein inhomogeneous magnetic fields are used concerns the time period during which the NMR data is recorded. Specifically, for NMR there are two time constants which are characteristic of relaxation mechanisms. The first time constant of interest is the time required for the nuclear magnetic moments to return to equilibrium after having been tilted by an excitation and preparation pulse sequence, such as an initial 90° pulse. This time constant ($T_1$), also commonly referred to as the spin-lattice relaxation time, is the time for longitudinal magnetization of the nuclei to be restored. The other time constant of interest is the time over which transverse components of the net magnetic moments randomly dephase in phase coherence after they have been tilted. This second time constant ($T_2$) is commonly referred to as the spin-spin relaxation time. $T_1$ is not equal to $T_2$. In fact, in biological tissue, $T_1$ is often approximately one order of magnitude (10×) greater than $T_2$. A related relaxation time of importance in MRI instruments using inhomogeneous fields is $T_2$ star ($T_2^*$). $T_2^*$ is the time constant that characterizes the rate at which transverse components loose their phase coherence due to the range of Larmor frequencies. As is known in the art, the dephasing characterized by $T_2^*$ may be reversed by applying a refocussing pulse to generate a spin echo. By adjusting the excitation and data recording timing sequences in an MRI instrument, it is well known that the resultant image can be characterized as either $T_1$ weighted or $T_2$ weighted.

It is known that once nuclei have been tilted by a 90° pulse at their Larmor frequency they must wait a period of time on the order of $T_1$ before the longitudinal magnetization is substantially restored. Consequently, since $T_1$ is approximately ten times longer that $T_2$, if spin echo signals are refocussed and recorded during a time period roughly equal to $T_2$, each refocussing and recording epoch should be followed by a waiting time period which is approximately equal to $9T_2$. During this hiatus, no further tilting or recording of refocussed spin echos is accomplished in order to allow restoration of the longitudinal magnetic moment. In the prior art, several techniques are disclosed to make use of this waiting time. In an article published in the Journal of Magnetic Resonance, Vol. 33 (1979) pp. 83–106 and entitled "Sensitivity and Performance Time in NMR Imaging", Brunner and R. R. Ernst demonstrate that refocussing and data recording of separate images that are adjacent and parallel to the original image can proceed during the aforementioned waiting time of the original image. Also, a method and apparatus for achieving a similar impulse like excitation and data acquisition sequence is disclosed by Ian R. Yoy in U.S. Pat. No. 4,558,278. Additionally, the role of data recordation times in efficiently computing $T_1$ and $T_2$ relaxations for refocussed spin echo pulse trains is disclosed in U.S. Pat. No. 5,055,788 which issued on Oct. 8, 1991 to Kleinberg et al. for an invention entitled Borehole Measurement of NMR Characteristics of Earth Formations.

As stated above, however, in an inhomogeneous field MRI system, the imaging of even a single image slice may require a large RF bandwidth. Stated differently, in light of the inhomogeneous field contemplated for the present invention, the total tissue slice for an inhomogeneous field device necessarily consists of a single image slice having a thickness on the order of 0.5 cm. The present invention recognizes that by imaging thin subslices of the total tissue slice being imaged, and by using different Larmor frequencies for each thin subslice, several advantages are obtained. First, the bandwidth of the RF pulse required for imaging each thin subslice is significantly reduced from the bandwidth required to image the total tissue slice. Second, after recording spin echoes for the image of one subslice, another subslice can be immediately imaged without waiting for $T_1$ of the previously imaged subslice to expire. Third, the recorded subslice images can be combined to construct a single image of the total tissue slice that is comparable in quality to the image which would result if the total tissue slice were simultaneously imaged using the larger bandwidth for the RF pulse.

In light of the above, it is an object of the present invention to provide a method and device for imaging in situ biological tissue which combines the images from several thin subslices to construct a single MRI image of the total slice of tissue. Another object of the present invention is to provide a method and device for imaging in situ biological tissue which can vary the number of subslices, and the time for recording spin echoes from each subslice, in order to $T_1$ or $T_2$ weight the resultant image of the total slice of tissue. Yet another object of the present invention is to provide for a method and device for imaging in situ biological tissue which effectively records spin echoes from a subslice of tissue during $T_1$ relaxation of an earlier recorded subslice. Still another object of the present invention is to provide a method for imaging in situ biological tissue when using a remotely positioned MRI device, which is easy to use, simple to implement, and comparatively cost effective.

SUMMARY OF THE INVENTION

In accordance with the present invention, a method for imaging a slice of in situ biological tissue requires use of a remotely positionable MRI device which generates an inhomogeneous magnetic field. Within the inhomogeneous magnetic field, the MRI device defines a measurement region which is configured as a relatively thin substantially flat layer having a planar surface. Additionally, the measurement region is characterized by a constant field magnitude measurement surface and a field gradient which is directed substantially normal to the surface of the measurement region.

To practice the method of the present invention, the MRI device is first positioned with the measurement region superposed over the slice of tissue to be imaged. The slice to be imaged is then divided into a plurality of sequentially layered thin subslices. More specifically, the slice is divided into n layered subslices where n is an integer approximately equal to $T_1/T_2$. As understood by those skilled in the art, $T_1$ is the spin lattice relaxation time of the nuclei and $T_2$ is the spin-spin relaxation time of the nuclei. For typical values of $T_1$ and $T_2$ the ratio $T_1/T_2$ will be approximately 10. Also, it will generally happen that each of the n subslices of tissue will be a layer of tissue having a thickness of approximately five one hundredths of a centimeter (0.05 cm).

With the measurement region of the MRI device positioned over all of the n subslices of in situ tissue to be imaged, each of the n subslices of tissue is individually selected and radiated with a 90° pulse of RF energy. This is done to tilt the nuclei of the tissue in the particular subslice. Because all n subslices will eventually be individually imaged, the 90° pulse for each subslice has a particular Larmor frequency that is determined and selected depending on the magnetic field strength at the specific subslice to be imaged. Also, because the thickness of each subslice is 1/n the thickness of the total slice to be imaged, the bandwidth required for pulses of the Larmor frequency is similarly reduced by the factor of 1/n. As a practical matter the particular Larmor frequency for a subslice is characterized by a bandwidth approximately equal to four hundred and twenty KiloHertz divided by n (420 KHz/n).

After the nuclei have been tilted with the 90° pulse, they are then refocussed with a train of 180° pulses to generate recordable spin echoes. Specifically, each 180° pulse in the train has the same particular Larmor frequency as the 90° tilting pulse for the specific subslice being imaged.

Spin echoes from the tilted nuclei in a subslice are recorded as the nuclei are refocussed by the train of 180° pulses to create a subslice image. The duration of the train of 180° pulses is variable and may be shorter or longer than the average value of $T_2$ for the tissue being imaged. If the duration is less than the average $T_2$, a $T_1$ weighing can be given to the subslice images. On the other hand, if the duration is greater than $T_2$, a $T_2$ weighing will be given to the subslice images.

As implied above, the process of selecting a particular Larmor frequency for a subslice of tissue, and then using 90° and 180° pulses of the particularly selected Larmor frequency to respectively tilt and refocus nuclei in the subslice is repeated for each of the n subslices. Specifically, this process is repeated until subslice images of all n subslices have been created. The n subslice images can be combined to construct a useable composite NMR image for the total slice of tissue containing the n subslices.

Since the measurement region of the MRI device is a substantially flat plane, the slice of tissue being imaged will be shaped as a slice of the in situ tissue. The subslices will thus be shaped as subslices which are sequentially layered with respect to each other. As contemplated for the present invention, the subslices can be irradiated in their sequential order to create subslice images or, each subsequently irradiated subslice can be separated from the immediately preceding irradiated subslice by at least one other subslice. Further, the method of the present invention contemplates encoding the tilted nuclei in each subslice by imposing an x and a y gradient on the nuclei. For the encoding, the x and y gradients may be the same for all n subslices, or it may be that at least two subslices have different x or y gradients.

A permissible assumption made by the present invention is that, because the slice of imaged tissue is relatively thin, biological tissue of the slice in the measurement region will be uniform in the direction of the field gradient $G_2$. Stated differently, it is assumed that the image of each subslice of tissue will look substantially the same as the image of all other subslices in the slice of tissue. This assumption, though valid for purposes of the present invention, can not be absolutely correct. Obviously, there will be minor variations in the constituency of tissue between any two subslices. The effect of these variations, however, can be greatly minimized. Specifically, the present invention recognizes that low spatial frequency encoding will produce images that have relatively poor resolution. On the other hand, the sensitivity of low spatial frequency encodings will exhibit less variation between any two subslices. High spatial frequency encoding will contribute to images that have good resolution, but may exhibit greater variation between any two subslices. Recognizing this, and relying on the assumption stated above, the method of the present invention envisions use of low spatial encoding for some subslices and high spatial encoding for the remainder to minimize the effects of variation in the content of image subslice.

In an alternate embodiment for the present invention each subslice can be used to generate a separate image. This may be particularly effective for a remotely positionable MRI device which is being used to create epidermal images from burn patients.

The novel features of this invention, as well as the invention itself, both as to its structure and its operation will be best understood from the accompanying drawings, taken in conjunction with the accompanying description, in which similar reference characters refer to similar parts, and in which:

DESCRIPTION OF THE PREFERRED EMBODIMENTS

Figure 1:
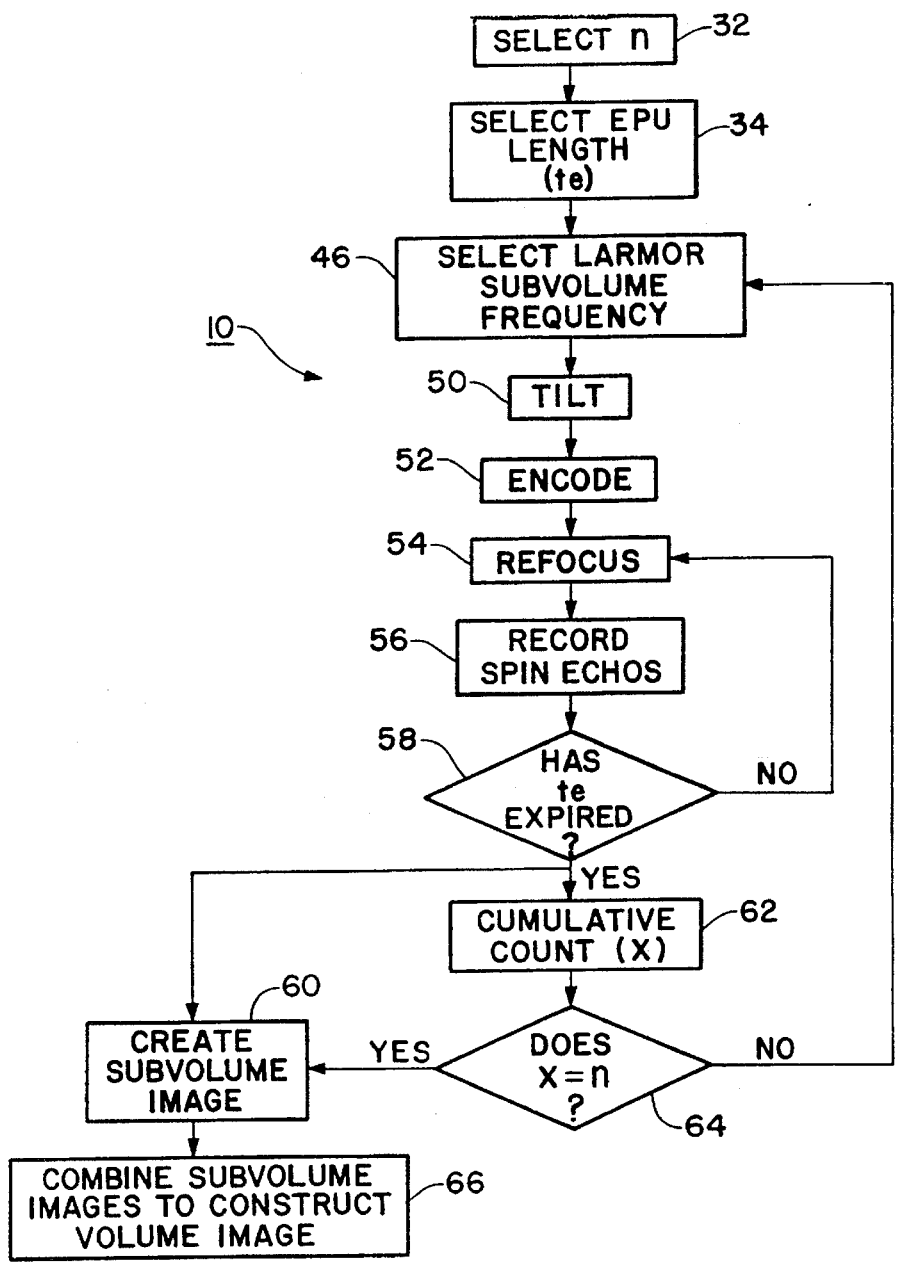
FIG. 1 is a flow chart of the steps to be performed during a cycle of the method of the present invention.

Referring initially to FIG. 1, the method of the present invention is presented as a flow chart of the steps involved and is generally designated 10. From an initial overview of the method 10 it will be appreciated that several iterative cycles in the sequence are required. Further, it will be appreciated that performance of the method 10 requires certain equipment. Specifically, a remotely positionable MRI device 12 is required.

Figure 2A:
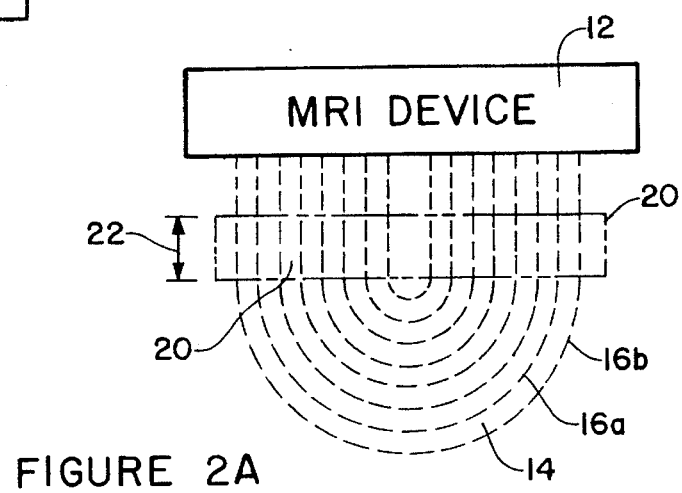
FIG. 2A is a schematic drawing of an MRI device and its associated inhomogeneous magnetic field.
Figure 2B:
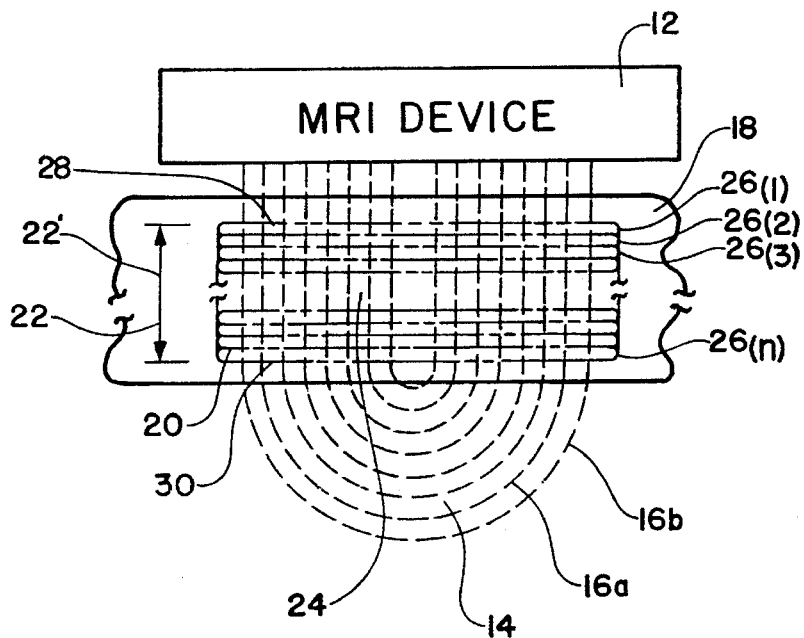
FIG. 2B is a schematic drawing of an MRI device remotely positioned relative to a slice of in situ biological material for performing the method of the present invention.

FIG. 2A is a schematic drawing that includes the MRI device 12, and indicates that device 12 is intended to generate an inhomogeneous magnetic field 14. In FIG. 2A, the inhomogeneous magnetic field 14 is generally represented by the flux lines 16a and 16b. FIG. 2A also shows that in accordance with the particular design configuration of MRI device 12 a measurement region 20 is established in the magnetic field 14. As intended for the present invention, and as shown in FIG. 2B, the MRI device 12 is remotely positioned relative to the biological tissue 18 that is to be imaged. This is done without surrounding or confining the patient or the tissue. Importantly, the measurement region 20 is intended to overlap, and thus be coincident with, the particular in situ slice 24 of biological tissue 18 that is to be imaged.

In order to obtain meaningful and realistic images of the tissue 18 in slice 24, measurement region 20 preferably has a generally flat layer-like configuration with an upper planar surface 28 and a lower planar surface 30. Further, the thickness 22 of measurement region 20 will be relatively small and, consequently, so will the thickness 22' of the imaged tissue slice 24 that is covered by the measurement region 20. Importantly, the measurement region 20 is established so that the magnetic field gradient, $G_z$, is oriented substantially perpendicular to the planar surfaces 28, 30 of the region 20. Thus, as will be appreciated by the skilled artisan, the field strength will change through the thickness 22' of the imaged tissue slice 24. For the preferred embodiment of the present invention, thickness 22 will be approximately one half centimeter (0.5 cm).

For reasons more fully discussed below, slice 24 of tissue 18 is effectively subdivided into n different individual subslices $26_{(1 \ldots n)}$. As indicated in FIG. 2B, the subslices 26 are contiguous and, like slice 24, are positioned within the measurement region 20. Also like slice 24, the subslices 26 each have a flat layer-like configuration, much like a sheet or a slice of material. Further, as will be more fully appreciated after further discussion of the present invention, the exact number of subslices, n, within the slice 24 of tissue 18 is selectively determined by the user. As shown in FIG. 2B, for convenient referencing, the subslices $26_{(1)}$, $26_{(2)}$, . . . $26_{(n)}$ are sequentially layered from top to bottom.

To begin the method 10 of the present invention, the MRI device 12 is positioned near tissue 18 to place the measurement region 20 over the slice 24 of tissue 18 to be imaged. As indicated by box 32 of the flow chart in FIG. 1, one of the first decisions to be made for the method 10 is to determine the number, n, of subslices 26 to be imaged. As indicated above, n is an integer which is to be determined according to considerations of nuclei response times to radiation.

To determine practical values for n, two time periods are of interest. The first is the time required for the nuclei to restore their equilibrium after they have been tilted by an initial 90° pulse. This time period ($T_1$), also commonly referred to as the spin-lattice time, is the time for longitudinal magnetization of the nuclei to be restored. The other time period of interest is the time over which components of the magnetic moments decay after they have been tilted. This second time period ($T_2$) is commonly referred to as the spin-spin relaxation time. Further, it is to be appreciated that both $T_1$ and $T_2$ will vary according to the particular tissue. As also indicated above, $T_1$ for a particular tissue is not equal to $T_2$. In fact, the average $T_1$ for a number of various tissues is approximately one order of magnitude (10×) greater than the average $T_2$ for the same tissue set (i.e. $T_1$ is approximately equal to $10 T_2$). The recording of spin echoes, however, is preferably accomplished during a specific epoch length $t_e$ which is approximately equal to the $T_2$ for the tissue. Thus, after each recording of spin echoes during the time $t_e$ there is a hiatus of at least approximately 9 $T_2$ before additional spin echoes from the tilted nuclei in the tissue are substantially restored to equilibrium. If, for example, spin echoes are first recorded for subslice $26_{(1)}$, the spin echoes from at least nine other subslices 26 can be recorded before a subsequent recording of spin echoes from subslice $26_{(1)}$ can again be made. Thus, to maximize the number of subslices for which all of the average $T_2$ is used for recording spin echoes, n will equal ten (10). In this case the resultant images will be fully $T_2$ weighted. As we shall see, for $T_1$ weighted images, not all of $T_2$ is used for recording spin echoes. Weighting depends on epoch length ($t_e$).

Box 34 of method 10 indicates that along with the determination and selection of n, an epoch length, $t_e$, is also to be selected. To be more specific, consider the epoch 36 shown in FIG. 3. As shown, the epoch 36 is used to image a subslice $26_{(3)}$ and includes a 90° pulse 38 and a following train of 180° of pulses 40. The epoch length, $t_e$, thus begins when nuclei in subslice $26_{(3)}$ are tilted by the 90° pulse 38, and ends upon cessation of the train of 180° of pulses 40 which are used to refocus the nuclei after they have been tilted. Importantly, because $t_e$ falls within the average $T_2$, it is also the time interval during which spin echoes from a subslice, such as subslice $26_{(3)}$, are recorded. As is well known and shown in FIG. 3, in order to obtain recordable spin echoes, both the pulse 38 and all of the pulses in the train 40 of epoch 36 will contain the same sub-bandwidth of Larmor frequencies $42_{(3)}$. From earlier discussions, it will be appreciated that the particular sub-bandwidth $42_{(3)}$ is required for the MRI of nuclei in the subslice $26_{(3)}$. For a more detailed discussion of the phenomenon involved in tilting and refocussing nuclei in an inhomogeneous magnetic field to generate recordable spin echoes, reference is made to U.S. Pat. No. 5,304,930, to issue on Apr. 19, 1994, for an invention entitled "Remotely Positioned MRI System" which is assigned to the assignee of the present invention and which is incorporated herein by reference.

Figure 3:
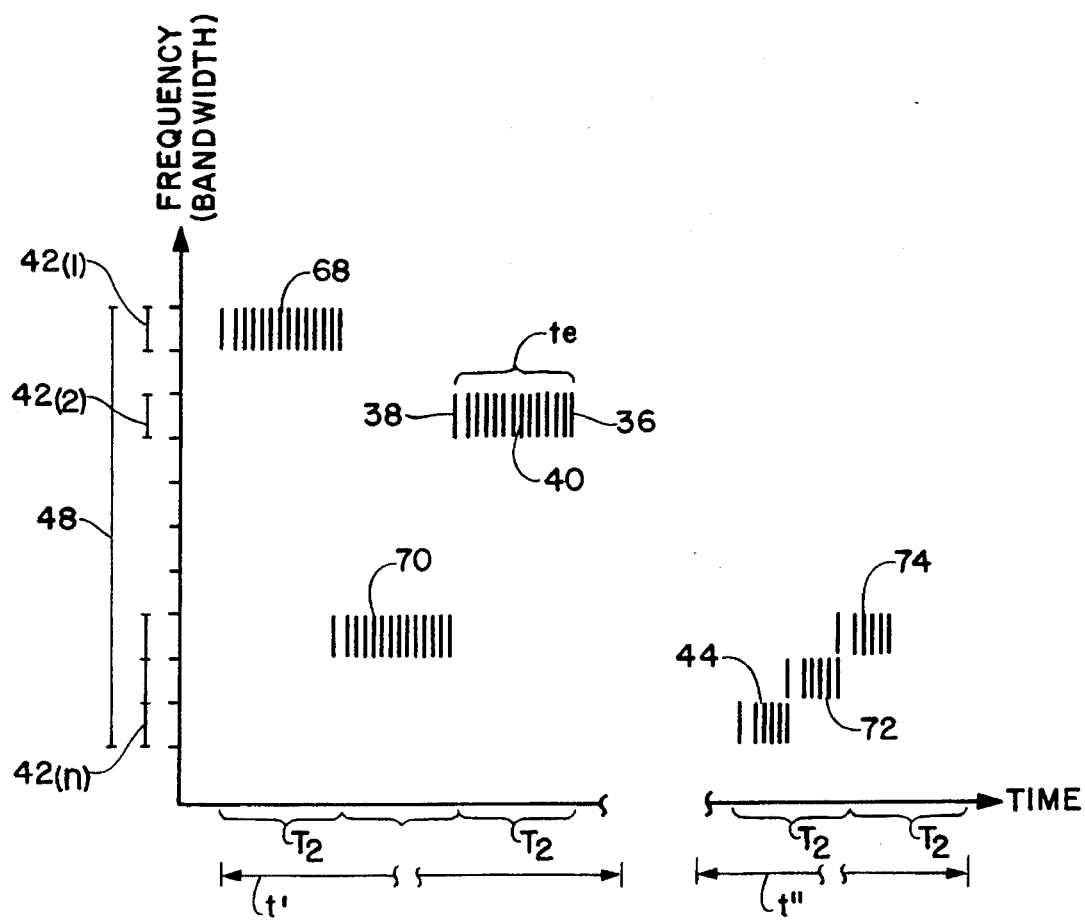
FIG. 3 is a graph showing the relationship between pulse frequency and time duration for each image recording epoch in a cycle of the method of the present invention.

As indicated in FIG. 3, $t_e$ may be equal to the average $T_2$ (as shown for epoch 36), or it may be of less duration (as is shown for epoch 44). Depending on how much of the average $T_2$ is taken to record the spin echo signals, the resultant image will be either $T_1$ weighted (only a portion of $T_2$ is used to record spin echoes) or $T_2$ weighted (all or substantially all of the average $T_2$ is used to record spin echoes).

Recall, the bandwidth required to effectively accomplish MRI using an inhomogeneous magnetic field is dependent on the field strength. For example, it is known that, in the presence of a field strength gradient ($G_z$) equal to 200 Gauss/cm, the Larmor frequency bandwidth required to effect MRI for a slice 24 of tissue 18 having a thickness 22' of 0.5 cm, will be about four hundred and twenty KiloHertz (420 KHz). In FIG. 3, this fact is indicated by the bandwidth 48 which would be required for MRI of the total slice 24. With this in mind, again consider subslice $26_{(3)}$. If ten is selected for the value of n (n=10), subslice $26_{(3)}$ will have only 1/10 of thickness 22', or about 0.05 cm Consequently, the Larmor frequency sub-bandwidth $42_{(3)}$ will be 1/10 of the bandwidth 48, or about forty-two KiloHertz (42 KHz).

The correlation between the slice of tissue to be imaged and the bandwidth required to image the slice is apparent.

Method 10 benefits from this correlation by dividing slice 24 into n subslices 26 and, similarly, dividing bandwidth 48 into n sub-bandwidths 42. Each of the n subslices $26_{(1 \ldots n)}$ is then separately imaged using the corresponding sub-bandwidth $42_{(1 \ldots n)}$. Specifically, for the example shown in FIG. 3, the subslices $26_{(1)}, 26_{(2)} \ldots 26_{(n)}$ are respectively imaged using sub-bandwidths $42_{(1)}, 42_{(2)} \ldots 42_{(n)}$. Note: the selection of a sub-bandwidth $42_{(1 \ldots n)}$ automatically also selects the particular subslice $26_{(1 \ldots n)}$ to be imaged.

The flow chart for method 10 shown in FIG. 1 indicates that after epoch length $t_e$ and a sub-bandwidth $42_{(-)}$ have been selected, the process of imaging the subslice $26_{()}$ begins. As shown by the boxes 50, 52, in the chart for method 10, the nuclei are first tilted using a 90° pulse, e.g. pulse 38, and they are then encoded with an x and y gradient in a manner well known in the art. Once the nuclei have been tilted, box 54 indicates they are refocussed using a train of 180° pulses, such as the pulses 40 of epoch 36. Considering boxes 54, 56 and 58 together, it will be appreciated that during an epoch length $t_e$ the nuclei are continuously refocussed and, each time they are refocussed, their spin echoes are recorded. According to box 58, this continues until $t_e$ expires.

Upon the expiration of $t_e$, two events occur. First, as indicated by box 60, the spin echoes recorded during $t_e$ are used to create an image of the subslice $26_{(1 \ldots n)}$ which can be subsequently joined with the image of other subslices $26_{(1 \ldots n)}$ to create a single image of the slices 24. Second, as indicated by the boxes 62 and 64, a progressive cumulative count is taken on the number of epochs (x) which have occurred and, hence, the number of subslices 26 which have thus far been imaged. As specifically indicated by box 64, if x does not equal n (i.e. x is less than n), then the method 10 returns to box 46 where another Larmor frequency sub-bandwidth $42_{(1 \ldots n)}$ is selected. For the present invention, the selection of sub-bandwidths $42_{(1 \ldots n)}$ is done according to a preprogrammed sequence. Another epoch is then run using the newly selected bandwidth $42_{(1 \ldots n)}$ for the recording of spin echoes and subsequent imaging of the affected subslice $26_{(1 \ldots n)}$. Once x is equal to n, all n subslices 26 in the slice 24 have been imaged, and, as indicated by the box 66, all images of the subslices 26 can be combined to construct a single image of the slice 24.

It happens naturally that subslices 26 of tissue 18 in slice 24 will be slightly dissimilar to each other. These dissimilarities will be in both tissue constitution and size configuration. However, due to the relative thinness of the slice 24 (0.5 cm), these dissimilarities can be considered minimal. Therefore, it can be assumed that all subslices 26 within the slice 24 are representative of the tissue 18 in slice 24. Nevertheless, some reconciliation between the subslices $26_{(1 \ldots n)}$ is desirable. As has been previously noted, low spatial frequency encodings contribute to images that have relatively poor resolution while high spatial frequency encodings contribute to images that have good resolution. Recognizing this, the method 10 of the present invention envisions use of low spatial encoding for some subslices 26 and high spatial encoding for the remainder of the subslices 26. This is done to obtain the benefits of each for the finally constructed image of the total slice 24. Specifically, a low spatial frequency encoding is preferably used for the outer subslices 26, such as subslice $26_{(1)}$ near upper surface 28, and subslice $26_{(n)}$ near lower surface 30. This is done in anticipation of the relatively small variations of low spatial frequency content across different subslices. On the other hand, high spatial frequency encoding is preferably used for subslices 26 in the middle of slice 24. This is done to avoid the greater sensitivity of high spatial frequency data across the different subslice. The subsequent combination results in a single image for the slice 24 that has both high and low spatial frequency content.

For examples of the operation of the method and device of the present invention, both $T_1$ weighted and $T_2$ weighted imaging will be considered. For $T_2$ weighted imaging, consider the time interval t' in FIG. 3. Within this time interval, the first epoch to be generated is the epoch 68. It will be noted that the epoch length, $t_e$, for epoch 68 has been selected to be approximately equal to the average value of $T_2$ for the tissue being imaged. Also, t' is equal to $nt_e$, for n equal to n, $nt_e$ will be approximately equal to the average $T_1$. Thus, the subslice image generated by epoch 68 will be $T_2$ weighted. Indeed, for $T_2$ weighted imaging, $t_e$ will always be approximately equal to the average $T_2$. Also, it will be noted that the sub-bandwidth $42_{(1)}$ was selected for epoch 68. Consequently, the subslice $26_{(1)}$ will be imaged by epoch 68. The next epoch in sequence is the epoch 70. Again $t_e$ is equal to $T_2$. For epoch 70, however, sub-bandwidth $42_{(n-2)}$ is used to image subslice $26_{(n-2)}$. Epoch 38 is next generated to image subslice $26_{(3)}$. This process continues a preselected sequence for imaging non-adjacent subslices 26 until all n subslices 26 in the slice 24 have been imaged. It is to be appreciated, however, that adjacent subslices 26 could have been sequentially imaged without disturbing the $T_2$ weighting tendency of the imaging.

The next example given here results in $T_1$ weighted images. Also, this example shows sequential imaging of adjacent subslices 26. For this example, consider the time interval t" shown in FIG. 3. Though more epochs will most like occur during the time interval t", the epochs 44, 72 and 74 are representative. Note that for each of the epochs 44, 72 and 74, the epoch interval $t_e$ is shorter than the average value for $T_2$. For instance, FIG. 3 specifically shows that both the epoch 44 and 74 are accomplished within an average time $T_2$. Again, for n equal to 10, $nt_e$ will be shorter in duration than the average value for $T_1$. Consequently, with shorter spin echo recording times, the images generated are $T_1$ weighted. Like the first example, however, the sub-bandwidths $42_{(1 \ldots n)}$ are again selected to establish the particular subslice $26_{(1 \ldots n)}$ to be imaged.

While the particular method and device for imaging a slice of in situ biological tissue as herein shown and disclosed in detail is fully capable of obtaining the objects and providing the advantages herein before stated, it is to be understood that it is merely illustrative of the presently preferred embodiments of the invention and that no limitations are intended to the details of the construction or design herein shown other than as defined in the appended claims.

We claim:

1. A method for imaging a slice of in situ biological tissue which comprises the steps of:

defining a measurement region in a nonhomogeneous magnetic field generated by a remotely positionable MRI device;

positioning said measurement region over the slice of tissue to be imaged;

dividing said slice into n sequentially layered subslices, n being approximately equal to $T_1/T_2$ where $T_1$ is the spin lattice relaxation time of nuclei of said tissue in said subslice and $T_2$ is the spin-spin relaxation time of said nuclei;

irradiating one said subslice with an excitation pulse, said pulse having a particular frequency for said subslice, to tilt nuclei of tissue in said subslice;

refocussing said tilted nuclei with a train of 180° pulses, each said 180° pulse having a particular frequency for said subslice, to generate recordable spin echoes; and recording said spin echoes from said tilted nuclei to create a subslice image.

2. A method as recited in claim 1 further comprising the steps of:

repeating said irradiating step, said refocussing step and said recording step to create a subslice image for each said subslice; and reconstructing said plurality of subslice images to create a composite image for said slice of tissue.

3. A method as recited in claim 2 wherein said dividing step is accomplished by using a different said particular frequency for each said subslice.

4. A method as recited in claim 2 further comprising the step of encoding said tilted nuclei in each said subslice by imposing an x and a y gradient on said nuclei.

5. A method as recited in claim 4 wherein said x gradient and said y gradient are the same for all said subslices.

6. A method as recited in claim 4 wherein at least two subslices have different x or y gradients.

7. A method as recited in claim 4 wherein said encoding step for at least one subslice is accomplished using a low spatial frequency and said encoding step for at least one other subslice is accomplished using a high spatial frequency.

8. A method as recited in claim 2 wherein said repeating step is accomplished by subsequently irradiating one said subslice separated from said immediately preceding radiated subslice by at least one other said subslice.

9. A method as recited in claim 2 wherein each said subslice of said tissue has a thickness of approximately five one hundredths of a centimeter (0.05 cm).

10. A method for constructing an image of a slice of in situ biological tissue using spin echo signals from nuclei in each of a plurality of subslices of the tissue, the method comprising the steps of:

determining a value for n, n being an integer having a value on the order of $T_1/T_2$, where $T_1$ is the spin lattice relaxation time of the nuclei being imaged and $T_2$ is the spin-spin relaxation time of the nuclei being imaged;

defining a measurement region in a nonhomogeneous magnetic field generated by a remotely positionable MRI device;

positioning said measurement region over said slice of tissue to be imaged with said measurement surface, dividing said slice of tissue to be imaged into n subslices;

establishing a particular Larmor frequency for each said subslice of tissue;

selectively irradiating each said subslice of tissue with its respective said particular Larmor frequency to obtain spin echo signals from nuclei in each said subslice to create n subslice images; and combining said n subslice images to construct an image of said slice of tissue.

11. A method as recited in claim 10 wherein said measurement region is configured as a substantially flat plane having a planar surface, and said measurement region is characterized by a field magnitude and a field gradient directed substantially normal to said planar surface of said measurement region.

12. A method as recited in claim 10 wherein each respective said particular Larmor frequency is characterized by a bandwidth approximately equal to five hundred KiloHertz divided by n (500 KHz/n).

13. A method as recited in claim 10 wherein said selectively irradiating step comprises the steps of:
  irradiating one said subslice with an excitation and preparation pulse to tilt nuclei of tissue in said subslice;
  refocussing said tilted nuclei with a train of 180° pulses to generate recordable spin echoes;
  recording spin echoes from said tilted nuclei to create a subslice image; and
  repeating said irradiating step, said refocussing step and said recording step to create a subslice image for each said subslice.

14. A method as recited in claim 13 wherein said repeating step is accomplished by subsequently irradiating one said subslice separated from said immediately preceding radiated subslice by at least one other said subslice.

15. A method as recited in claim 13 wherein the duration of said train of 180° pulses is variable.

16. A method as recited in claim 13 wherein said train has a duration less than $T_2$ to give a $T_1$ weighing to said subslice images.

17. A method as recited in claim 13 wherein said train has a duration greater than $T_2$ to give a $T_2$ weighing to said subslice images.

18. A method as recited in claim 13 further comprising the step of encoding said tilted nuclei in each said subslice by imposing an x and a y gradient on said nuclei.

19. A method as recited in claim 18 wherein said x gradient and said y gradient are the same for all said subslices.

20. A method as recited in claim 18 wherein at least two subslices have different x or y gradients.

21. A method as recited in claim 20 wherein said encoding step for at least one subslice is accomplished using a low spatial frequency and said encoding step for at least one other subslice is accomplished using a high spatial frequency.

22. A method as recited in claim 10 wherein each said subslice of said tissue has a thickness of approximately five one hundredths of a centimeter (0.05 cm).

23. A device for constructing an image of a slice of in situ biological tissue using spin echo signals from nuclei in each of a plurality of subslices of the tissue which comprises:
  a magnet for generating a nonhomogeneous magnetic field, said nonhomogeneous magnetic field having a defined measurement region therein, and said magnet being remotely moveable to position said measurement region over the slice of tissue to be imaged;
  means for dividing said slice into n sequentially layered subslices with each said subslice having a particular Larmor frequency, n being an integer having a value less than $T_1/T_2$, where $T_1$ is the spin lattice relaxation time of the nuclei being imaged and $T_2$ is the spin-spin relaxation time of the nuclei being imaged;
  means for selectively irradiating each of said n subslices of the tissue with its respective particular Larmor frequency to obtain spin echo signals from nuclei in each said subslice to create n subslice images; and
  means for combining said n subslice images to construct an image of said slice of tissue.

24. A device as recited in claim 23 wherein said selective irradiating means further comprises:
  means for irradiating one said subslice with an excitation pulse to tilt nuclei of tissue in said subslice; and
  means for refocussing said tilted nuclei with a train of 180° pulses to generate recordable spin echoes.

25. A device as recited in claim 23 further comprising means for encoding said tilted nuclei in each said subslice by imposing an x and a y gradient on said nuclei.

26. A method for imaging a slice of in situ biological tissue which comprises the steps of:
  defining a measurement region in a nonhomogeneous magnetic field generated by a remotely positionable MRI device;
  positioning said measurement region over the slice of tissue to be imaged;
  dividing said slice into n sequentially layered subslices, n being approximately equal to $T_1/T_2$ where $T_1$ is the spin lattice relaxation time of nuclei in said tissue in said subslice and $T_2$ is the spin-spin relaxation time of said nuclei;
  irradiating one said subslice with an excitation pulse, said pulse having a different particular frequency for each said subslice, to tilt said nuclei of said tissue in said subslice;
  refocussing said tilted nuclei with a train of 180° pulses, each said 180° pulse having a particular frequency for said subslice, to generate recordable spin echoes;
  recording said spin echoes from said tilted nuclei to create a subslice image;
  repeating said irradiating step, said refocussing step and said recording step to create a subslice image for each said subslice; and
  reconstructing said plurality of subslice images to create a composite image for said slice of tissue.

27. A method for imaging a slice of in situ biological tissue which comprises the steps of:
  defining a measurement region in a nonhomogeneous magnetic field generated by a remotely positionable MRI device;
  positioning said measurement region over the slice of tissue to be imaged;
  dividing said slice into n sequentially layered subslices, n being no greater than $T_1/T_2$ where $T_1$ is the spin lattice relaxation time of nuclei of said tissue in said subslice and $T_2$ is the spin-spin relaxation time of said nuclei;
  irradiating one said subslice with an excitation pulse, said pulse having a particular frequency for said subslice, to tilt nuclei of tissue in said subslice;
  refocussing said tilted nuclei with a train of 180° pulses, each said 180° pulse having a particular frequency for said subslice, to generate recordable spin echoes; and
  recording said spin echoes from said tilted nuclei to create a subslice image.

28. A method as recited in claim 26 wherein said train has a duration of less than $T_2$.

* * * * *